(12) United States Patent
Park et al.

(10) Patent No.: US 11,798,912 B2
(45) Date of Patent: Oct. 24, 2023

(54) BONDING APPARATUS AND METHOD OF FABRICATING DISPLAY DEVICE USING THE SAME

(71) Applicant: Samsung Display Co., LTD., Yongin-si (KR)

(72) Inventors: Taeyoung Park, Asan-si (KR); Jungseon Park, Cheonan-si (KR); Jun-Hee Lee, Seoul (KR); Hyunwoo Lee, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 525 days.

(21) Appl. No.: 17/123,836

(22) Filed: Dec. 16, 2020

(65) Prior Publication Data

US 2021/0305201 A1 Sep. 30, 2021

(30) Foreign Application Priority Data

Mar. 27, 2020 (KR) .................. 10-2020-0037422

(51) Int. Cl.
*B32B 41/00* (2006.01)
*H01L 23/00* (2006.01)
(Continued)

(52) U.S. Cl.
CPC .............. *H01L 24/80* (2013.01); *H01L 24/74* (2013.01); *H01L 24/75* (2013.01); *H01L 24/83* (2013.01);
(Continued)

(58) Field of Classification Search
CPC ......... H01L 24/80; H01L 24/74; H01L 24/75; H01L 24/83; H01L 2224/75701; H01L 2224/75753; H01L 2224/75754; H01L 2224/75804; H01L 2224/8013; H01L 2224/80132; H01L 2224/80205; H01L 2224/8313; H01L 2224/83132; H01L 2224/75802; H05K 3/323; H05K 3/328; H05K 2203/0285; H05K 2203/1509;
(Continued)

(56) References Cited

U.S. PATENT DOCUMENTS

2011/0023296 A1\* 2/2011 Muraoka ................. H01L 24/75
29/832
2019/0196632 A1 6/2019 Ryu et al.
2021/0394498 A1\* 12/2021 Sharp ...................... B32B 41/00

FOREIGN PATENT DOCUMENTS

KR 10-1148322 5/2012
KR 10-2019-0076091 7/2019

\* cited by examiner

*Primary Examiner* — Michael N Orlando
*Assistant Examiner* — Joshel Rivera
(74) *Attorney, Agent, or Firm* — KILE PARK REED & HOUTTEMAN PLLC

(57) ABSTRACT

A method of fabricating a display device may include disposing a display panel on a stage to be parallel to an XZ-plane defined by a horizontal X-axis and a vertical Z-axis, measuring a height of a first side surface of the display panel in a direction of the Z-axis, rotating the stage such that the first side surface is parallel to a reference horizontal line in case that a result of the measured height indicates that the first side surface includes an inclined surface, moving the display panel in a direction of the Z-axis such that a first pad disposed on the first side surface overlaps the reference horizontal line, and bonding a second pad of a printed circuit board with the first pad.

17 Claims, 18 Drawing Sheets

(51) Int. Cl.
*H05K 3/32* (2006.01)
*H10K 59/131* (2023.01)

(52) U.S. Cl.
CPC ............. *H05K 3/323* (2013.01); *H05K 3/328* (2013.01); *H01L 2224/75701* (2013.01); *H01L 2224/75753* (2013.01); *H01L 2224/75754* (2013.01); *H01L 2224/75804* (2013.01); *H01L 2224/8013* (2013.01); *H01L 2224/80132* (2013.01); *H01L 2224/80205* (2013.01); *H01L 2224/8313* (2013.01); *H01L 2224/83132* (2013.01); *H05K 2203/0285* (2013.01); *H05K 2203/1509* (2013.01); *H05K 2203/166* (2013.01); *H05K 2203/167* (2013.01); *H10K 59/131* (2023.02)

(58) Field of Classification Search
CPC ....... H05K 2203/166; H05K 2203/167; H05K 1/0269; H05K 1/189; H05K 2201/09918; H05K 2201/10128; H05K 13/0061; H05K 13/0015; H05K 13/02; H10K 59/131; H10K 59/1201; G02F 1/1303; G02F 1/1313
USPC .................... 156/60, 64, 350, 351, 378, 379
See application file for complete search history.

BONDING APPARATUS AND METHOD OF FABRICATING DISPLAY DEVICE USING THE SAME

CROSS-REFERENCE TO RELATED APPLICATION(S)

This U.S. non-provisional patent application claims priority to Korean Patent Application No. 10-2020-0037422 under 35 U.S.C. § 119, filed in the Korean Intellectual Property Office (KIPO) on Mar. 27, 2020, the entire contents of which are hereby incorporated by reference.

BACKGROUND

The disclosure relates to a bonding apparatus and a method of fabricating a display device using the same.

In general, a display device includes a display panel, which includes pixels to display an image, a driver, which applies a driving signal to the pixels, and a printed circuit board, on which the driver is disposed. The printed circuit board is electrically connected to the display panel. The driver is electrically connected to the display panel through the printed circuit board.

First pads electrically connected to the pixels are disposed on the display panel, and second pads electrically connected to the driver are disposed on the printed circuit board. The driver is electrically connected to the pixels by bonding the second pads to the first pads. The bonding of the first and second pads is performed by an ultrasonic bonding method or an anisotropic conductive film (ACF) bonding method. Recently, a lateral bonding technology of vertically disposing the printed circuit board and electrically connecting it to a side surface of the display panel has been developed.

SUMMARY

An embodiment of the disclosure provides a bonding apparatus capable of easily bonding a printed circuit board to a display panel and a method of fabricating a display device using the same.

According to an embodiment of the disclosure, a method of fabricating a display device may include disposing a display panel on a stage to be parallel to an XZ-plane defined by a horizontal X-axis and a vertical Z-axis, measuring a height of a first side surface of the display panel in a direction of the Z-axis, rotating the stage such that the first side surface is parallel to a reference horizontal line in case that measured heights indicate that the first side surface includes an inclined surface, moving the display panel in a direction of the Z-axis such that a first pad disposed on the first side surface overlaps the reference horizontal line, and bonding a second pad of a printed circuit board with the first pad.

In an embodiment, the method may include determining that the inclined surface includes a first inclined surface, which is inclined when viewed in a direction of the X-axis; and determining that the inclined surface includes a second inclined surface, which is inclined when viewed in a direction of a Y-axis perpendicular to the XZ-plane. The reference horizontal line may include a first reference horizontal line parallel to the Y-axis; and a second reference horizontal line parallel to the X-axis In an embodiment, the rotating of the stage may include rotating the stage about a first rotation axis parallel to the X-axis such that the first inclined surface is parallel to the first reference horizontal line.

In an embodiment, the moving of the display panel in the direction of the Z-axis may include measuring a height of the first pad; and moving the stage in the direction of the Z-axis such that the first pad overlaps the first reference horizontal line.

In an embodiment, the rotating of the stage may include rotating the stage about a second rotation axis parallel to the Y-axis such that the second inclined surface is parallel to the second reference horizontal line.

In an embodiment, the moving of the display panel in the direction of the Z-axis may include measuring a height of the first pad; and moving the stage in the direction of the Z-axis such that the first pad overlaps the second reference horizontal line.

In an embodiment, the moving of the display panel in the direction of the Z-axis may include disposing a top surface of the first pad to overlap the reference horizontal line.

In an embodiment, the bonding of the second pad with the first pad may include placing a bonding region of the printed circuit board, on which the second pad is disposed, on the first pad with the second pad facing the first pad; aligning the first pad and the second pad with each other; and bonding the second pad with the first pad.

In an embodiment, the aligning of the first pad and the second pad may include placing a fixing portion on the bonding region; obtaining an image of a first mark disposed on the first side surface and an image of a second mark disposed on a bottom surface of the bonding region; and disposing the second mark to overlap the first mark, based on a result of the obtained images.

In an embodiment, the bonding of the second pad with the first pad may include applying an ultrasonic wave to the second pad to bond the second pad with the first pad.

In an embodiment, the bonding of the second pad with the first pad may include disposing an anisotropic conductive film between the first pad and the second pad; and bonding the second pad with the first pad using the anisotropic conductive film.

In an embodiment, the display panel may include opposite side surfaces that are parallel to the Z-axis and are opposite to each other in a direction of the X-axis; and a second side surface that is opposite to the first side surface and is parallel to the direction of the X-axis.

In an embodiment, the display panel may include opposite side surfaces that extend from both ends of the first side surface in a direction perpendicular to the first side surface; and a second side surface that is opposite to the first side surface and extends parallel to the first side surface.

According to an embodiment of the disclosure, a method of fabricating a display device may include disposing a display panel on a stage to be parallel to an XZ-plane defined by a horizontal X-axis and a vertical Z-axis; measuring a height of a first side surface of the display panel in a direction of the Z-axis; rotating the stage such that a top surface of a first pad disposed on the first side surface overlaps a reference horizontal line in case that measured heights indicate that the first side surface includes an inclined surface, and bonding a second pad of a printed circuit board with the first pad.

In an embodiment, the method may include determining that the inclined surface includes a first inclined surface, which is inclined when viewed in a direction of the X-axis; and determining that the inclined surface includes a second inclined surface, which is inclined when viewed in a direction of a Y-axis perpendicular to the XZ-plane. The reference horizontal line may include a first reference horizontal line parallel to the Y-axis; and a second reference horizontal line parallel to the X-axis.

In an embodiment, the rotating of the stage may include rotating the stage about a first rotation axis parallel to the X-axis such that the top surface of the first pad overlaps the first reference horizontal line.

In an embodiment, the rotating of the stage may include rotating the stage about a second rotation axis parallel to the Y-axis such that the top surface of the first pad overlaps the second reference horizontal line.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
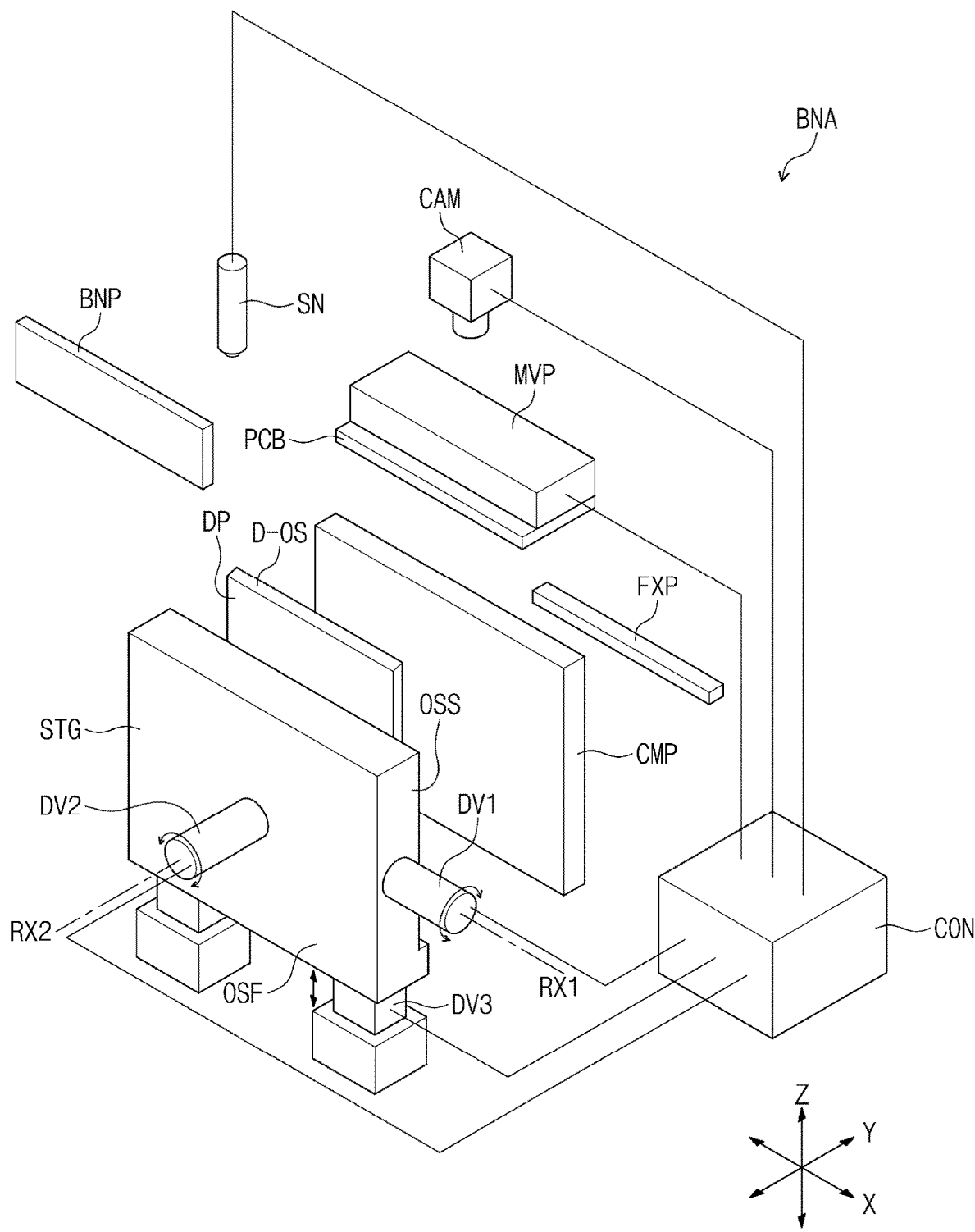
FIG. 1 is a perspective view schematically illustrating a bonding apparatus according to an embodiment of the disclosure.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments of the disclosure will now be described more fully with reference to the accompanying drawings, in which example embodiments are shown. Example embodiments of the disclosure may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first," "second," and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein can be interpreted accordingly.

The terminology used herein is for the purpose of describing particular embodiments only and is not intended to be limiting example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Example embodiments of the disclosure are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the disclosure should not be construed as limited to the particular shapes of regions illustrated herein but are to include deviations in shapes that result, for example, from manufacturing.

Unless otherwise defined or implied herein, all terms (including technical and scientific terms) used herein have the same meaning as commonly understood by one of ordinary skill in the art to which example embodiments of the disclosure pertain. It will be further understood that terms, such as those defined in commonly-used dictionaries, should be interpreted as having a meaning that is consistent with their meaning in the context of the relevant art and will not be interpreted in an idealized or excessively formal sense unless clearly defined herein.

FIG. 1 is a perspective view schematically illustrating a bonding apparatus according to an embodiment of the inventive concept.

Referring to FIG. 1, a bonding apparatus BNA may include a stage STG, a clamp CMP, a first driver DV1, a second driver DV2, a third driver DV3, a substrate moving portion MVP, a bonding portion BNP, a fixing portion FXP, a sensor portion SN, a camera portion CAM, and a controller CON.

A display panel DP may be disposed on the stage STG. The stage STG may fasten the display panel DP in a vacuum suction manner. For example, holes may be defined in the stage STG, and the display panel DP may be held to the stage STG by a suction force, which is exerted from the holes in a vacuum state.

In an embodiment, the display panel DP may be a light-emitting type display panel, but the disclosure is not limited to a specific type of the display panel DP. For example, the display panel DP may be an organic light-emitting display panel or a quantum-dot light-emitting display panel. A light-emitting layer of the organic light-emitting display panel may be formed of or include an organic light-emitting material. A light-emitting layer of the quantum-dot light-emitting display panel may include quantum dots and quantum rods. For the sake of simplicity, the following description will refer to an example in which the display panel DP is the organic light-emitting display panel.

The display panel DP and the stage STG may be disposed parallel to an XZ-plane, which is defined by a horizontal X-axis X and a vertical Z-axis Z. An upper portion of the display panel DP may be disposed above an upper portion of the stage STG. An axis that is perpendicular to the XZ-plane may be defined as a Y-axis Y.

The clamp CMP may be spaced apart from the stage STG in the direction parallel to the Y-axis Y. The clamp CMP may be disposed parallel to the XZ-plane. The display panel DP may be disposed between the clamp CMP and the stage STG. The clamp CMP may be used to fasten the display panel DP to the stage STG.

The first driver DV1 may extend in a direction parallel to the X-axis X and may be connected to a first side surface OSS, which is one of side surfaces of the stage STG that are opposite to each other in the direction parallel to the X-axis X. The first driver DV1 may be configured to rotate about a first rotation axis RX1 parallel to the X-axis X. The first driver DV1 may be configured to rotate the stage STG about the first rotation axis RX1.

The second driver DV2 may extend in a direction parallel to the Y-axis Y and may be connected to a first surface OSF of the stage STG, which is one of surfaces of the stage STG that are opposite to each other in the direction parallel to the Y-axis Y. The second driver DV2 may be configured to rotate about a second rotation axis RX2 parallel to the Y-axis Y. The second driver DV2 may be configured to rotate the stage STG about the second rotation axis RX2.

The third driver DV3 may be connected to a lower portion of the stage STG. The third driver DV3 may be configured to be movable in the Z-axis Z and to move the stage STG in the Z-axis Z.

The sensor portion SN may be disposed on a first side surface D-OS of the display panel DP in the Z-axis Z. The first side surface D-OS of the display panel DP may be defined as a top portion of the display panel DP. In an embodiment, the sensor portion SN may be a distance measurement sensor using a laser beam and may be used to measure a height of the first side surface D-OS. Information obtained by the sensor portion SN may be provided to the controller CON.

The controller CON may drive the first driver DV1, the second driver DV2, and the third driver DV3, based on the measurement results obtained by the sensor portion SN. For example, the stage STG may be moved by operations of the first driver DV1, the second driver DV2, and the third driver DV3, such that the first side surface D-OS of the display panel DP is disposed on a reference horizontal line for performing a bonding process. This operation will be described in more detail with reference to a display device fabricating method below.

The substrate moving portion MVP may be disposed on a printed circuit board PCB. The substrate moving portion MVP may be used to suck up the printed circuit board PCB and to move the printed circuit board PCB. The substrate moving portion MVP may suck up the printed circuit board PCB with a vacuum suction method. For the bonding process, the substrate moving portion MVP may move the printed circuit board PCB to a region on the display panel DP.

The printed circuit board PCB may be a flexible printed circuit board. However, the disclosure is not limited to this example, and in an embodiment, the printed circuit board PCB may be of a rigid type. The printed circuit board PCB may be disposed parallel to an XY-plane defined by the X-axis X and the Y-axis Y.

The camera portion CAM may be disposed on the display panel DP and the printed circuit board PCB. The camera portion CAM may be used to obtain images of a first mark and a second mark, which are disposed on the display panel DP and the printed circuit board PCB, respectively. Information including position information of the first and second marks, images of which are taken by the camera portion CAM, may be provided to the controller CON.

Based on the position information of the first and second marks, the controller CON may control the movement of the substrate moving portion MVP, such that the first mark is aligned with the second mark. As a result, the printed circuit board PCB and the display panel DP may be disposed at desired positions.

The fixing portion FXP may extend in the direction parallel to the X-axis X. Before taking the images of the first and second marks using the camera portion CAM, the fixing portion FXP may fasten a portion of the printed circuit board PCB disposed on the display panel DP. The fixing portion FXP may have an optically transparent property. For example, the fixing portion FXP may be formed of or include quartz.

The bonding portion BNP may extend in the direction parallel to the X-axis X. The bonding portion BNP may be disposed on the printed circuit board PCB after the alignment of the printed circuit board PCB and the display panel DP. The bonding portion BNP may be used to bond the printed circuit board PCB with the first side surface D-OS of the display panel DP. A detailed operation of the bonding portion BNP will be described below in more detail with reference to a display device fabricating method.

Figure 2:
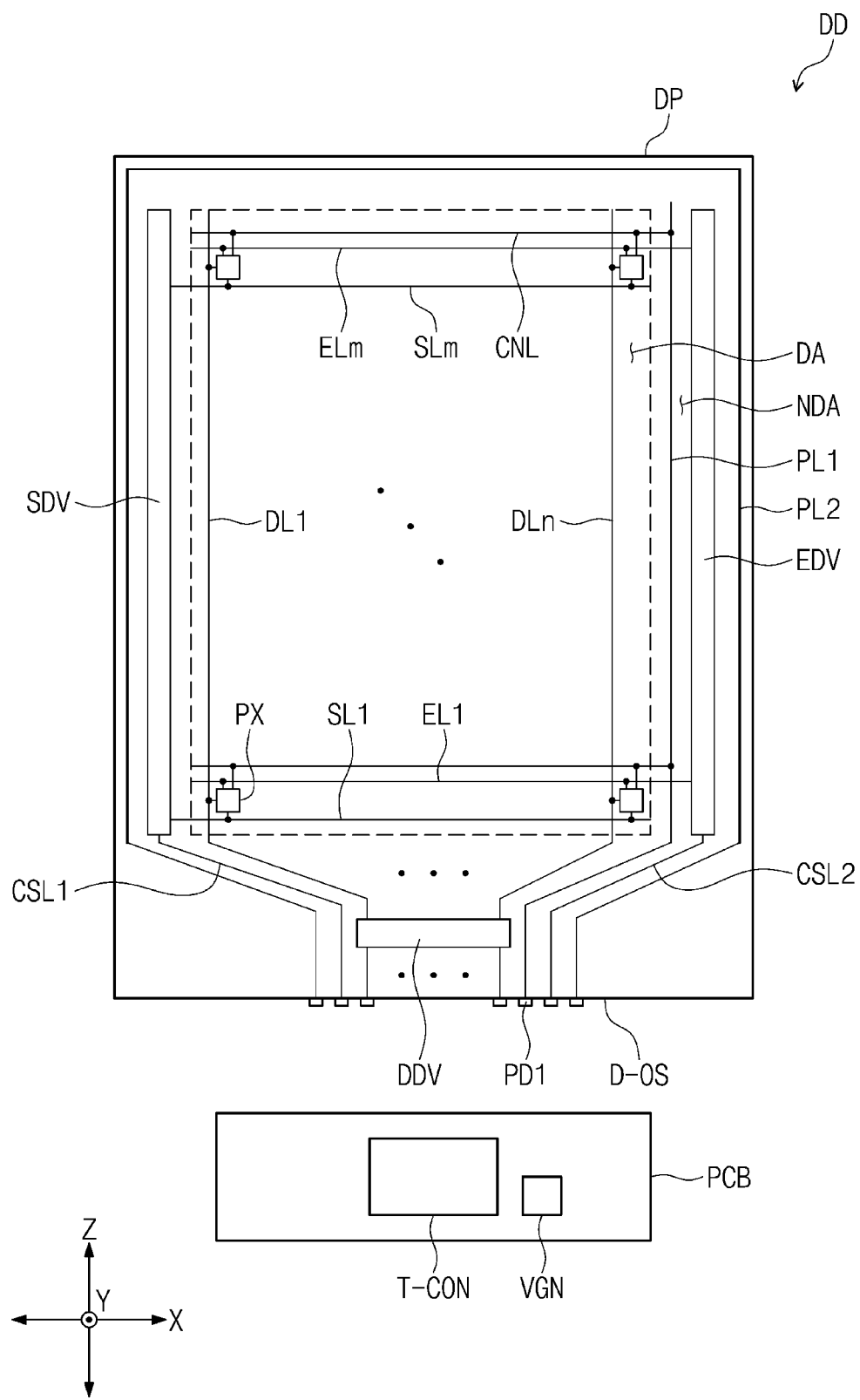
FIG. 2 is a diagram schematically illustrating a planar structure of a display panel of FIG. 1.

FIG. 2 is a diagram schematically illustrating a planar structure of a display panel of FIG. 1.

Referring to FIG. 2, a display device DD may include the display panel DP, a scan driver SDV, a data driver DDV, an emission driver EDV, the printed circuit board PCB, a timing controller T-CON, and a voltage generation portion VGN.

The display panel DP may have a rectangular shape, long sides of which extend parallel to the Z-axis Z and short sides of which extend parallel to the X-axis X, but the shape of the display panel DP is not limited thereto. The display panel DP may include a display region DA and a non-display region NDA enclosing the display region DA.

The display panel DP may include pixels PX, scan lines SL1 to SLm, data lines DL1 to DLn, emission lines EL1 to ELm, first and second control lines CSL1 and CSL2, first and second power lines PL1 and PL2, connection lines CNL, and first pads PD1, where m and n are natural numbers.

The pixels PX may be disposed in the display region DA. The scan driver SDV and the emission driver EDV may be disposed in portions of the non-display region NDA, which is adjacent to each of the long sides of the display panel DP. The data driver DDV may be disposed in a portion of the non-display region NDA, which is adjacent to one of the short sides of the display panel DP. In a plan view, the data driver DDV may be disposed adjacent to a bottom end of the display panel DP.

The data driver DDV may be fabricated in the form of an integrated-circuit chip and then may be mounted on the display panel DP. However, the disclosure is not limited to this example, and in an embodiment, the data driver DDV may be mounted on a flexible circuit board, which is electrically connected to the display panel DP, and may be electrically connected to the display panel DP through the flexible circuit board.

The scan lines SL1 to SLm may extend in the direction parallel to the X-axis X and may be electrically connected to the pixels PX and the scan driver SDV. The data lines DL1 to DLn may extend in the direction parallel to the Z-axis Z and may be electrically connected to the pixels PX and the data driver DDV. The emission lines EL1 to ELm may extend in the direction parallel to the X-axis X and may be electrically connected to the pixels PX and the emission driver EDV.

The first power line PL1 may extend in the direction parallel to the Z-axis Z and may be disposed in the non-display region NDA. The first power line PL1 may be disposed between the display region DA and the emission driver EDV but the disclosure is not limited to this example. For example, in an embodiment, the first power line PL1 may be disposed between the display region DA and the scan driver SDV.

The connection lines CNL may be disposed in the display region DA, may extend in the direction parallel to the X-axis X, and may be arranged in the direction parallel to the Z-axis Z. The connection lines CNL may be electrically connected to the first power line PL1 and the pixels PX. A first voltage may be applied to the pixels PX through the first power line PL1 and the connection lines CNL, which are electrically connected to each other.

The second power line PL2 may be disposed in the non-display region NDA. The second power line PL2 may extend along the long sides of the display panel DP and along another short side of the display panel DP, near which the data driver DDV is not disposed. The second power line PL2 may be disposed outside the scan driver SDV and the emission driver EDV.

Although not shown, the second power line PL2 may extend toward the display region DA and may be electrically connected to the pixels PX. A second voltage, the level of which is lower than that of the first voltage, may be applied to the pixels PX through the second power line PL2.

The first control line CSL1 may be electrically connected to the scan driver SDV and may extend toward the bottom end of the display panel DP in a plan view. The second control line CSL2 may be electrically connected to the emission driver EDV and may extend toward the bottom end of the display panel DP in a plan view. The data driver DDV may be disposed between the first control line CSL1 and the second control line CSL2.

The first pads PD1 may be disposed on the bottom end of the display panel DP. The bottom end of the display panel DP may be the first side surface D-OS of the display panel DP shown in FIG. 1. The data lines DL1 to DLn may be electrically connected to the data driver DDV, and the data driver DDV may be electrically connected to the first pads PD1 corresponding to the data lines DL1 to DLn. The first power line PL1, the second power line PL2, the first control line CSL1, and the second control line CSL2 may be electrically connected to corresponding ones of the first pads PD1.

The printed circuit board PCB may be electrically connected to the first pads PD1. Unlike the printed circuit board PCB of FIG. 1, the printed circuit board PCB in the embodiment of FIG. 2 is disposed parallel to the display panel DP.

The timing controller T-CON and the voltage generation portion VGN may be disposed on the printed circuit board PCB. The timing controller T-CON may be fabricated in the form of an integrated-circuit chip and then may be mounted on the printed circuit board PCB. The timing controller T-CON may be electrically connected to the first pads PD1, which are electrically connected to the data driver DDV and the first and second control lines CSL1 and CSL2, through the printed circuit board PCB.

The timing controller T-CON may generate a scan control signal, a data control signal, and an emission control signal. The scan control signal may be provided to the scan driver SDV through the first control line CSL1. The emission control signal may be provided to the emission driver EDV through the second control line CSL2. The data control signal may be provided to the data driver DDV. The timing controller T-CON may provide image signals to the data driver DDV.

The scan driver SDV may produce scan signals in response to the scan control signal, and the scan signals may be applied to the pixels PX through the scan lines SL1 to SLm. The data driver DDV may produce data voltages corresponding to image signals in response to the data control signal. The data voltages may be applied to the pixels PX through the data lines DL1 to DLn. The emission driver EDV may produce emission signals in response to the emission control signal, and the emission signals may be applied to the pixels PX through the emission lines EL1 to ELm.

The voltage generation portion VGN may be electrically connected to the first pads PD1, which are electrically connected to the first and second power lines PL1 and PL2. The voltage generation portion VGN may be configured to produce first and second voltages.

The pixels PX may receive the data voltages in response to the scan signals. The pixels PX may be configured to emit light, which has a brightness level corresponding to the data voltage, in response to the emission signals, and to display an image. A light-emitting time of the pixel PX may be controlled by the emission signals.

Figure 3:
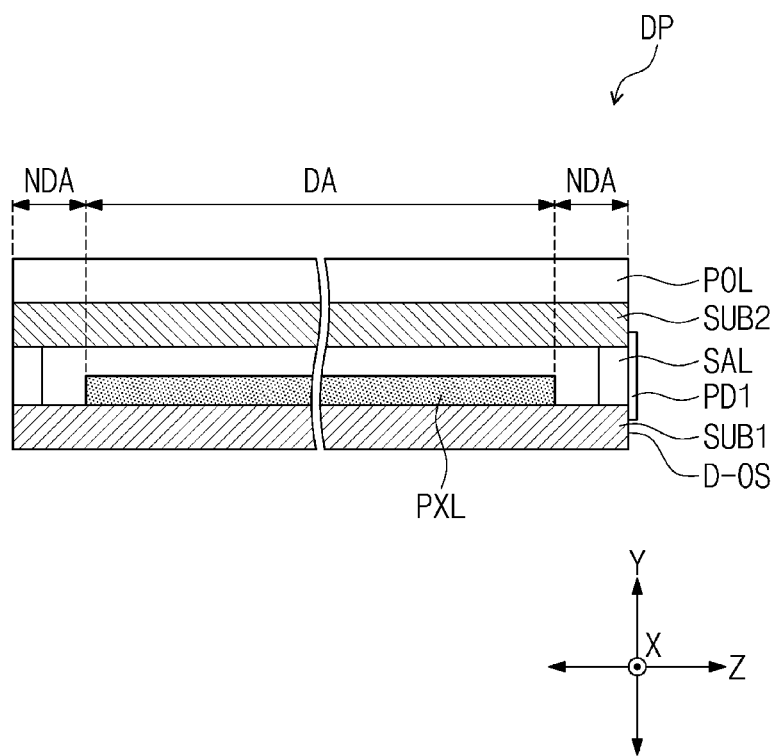
FIG. 3 is a diagram exemplarily schematically illustrating a sectional structure of a display panel of FIG. 2.

FIG. 3 is a diagram schematically illustrating an exemplary sectional structure of a display panel of FIG. 2.

Referring to FIG. 3, the display panel DP may include a first substrate SUB1, a second substrate SUB2, an encapsulation layer SAL, a pixel layer PXL, and a polarization layer POL. The second substrate SUB2 may be disposed on the first substrate SUB1. Each of the first substrate SUB1 and the second substrate SUB2 may include a synthetic resin substrate or a glass substrate. The pixel layer PXL may be disposed between the first substrate SUB1 and the second substrate SUB2. The pixel layer PXL may be disposed on the first substrate SUB1. The pixel layer PXL may include the pixels PX shown in FIG. 2.

The encapsulation layer SAL may be disposed between the first substrate SUB1 and the second substrate SUB2. The encapsulation layer SAL may be disposed around the pixel layer PXL. The encapsulation layer SAL may be disposed in the non-display region NDA of the first substrate SUB1 to enclose the pixel layer PXL. The first substrate SUB1 and the second substrate SUB2 may be bonded with each other by the encapsulation layer SAL. The pixel layer PXL may be hermetically sealed by the second substrate SUB2 and the encapsulation layer SAL, and thus, it may be possible to prevent a failure of the pixels PX from occurring by moisture and an external contamination material.

Although the second substrate SUB2 and the encapsulation layer SAL are used to hermetically seal the pixel layer PXL, the disclosure is not limited to this example. For example, the second substrate SUB2 and the encapsulation layer SAL may not be used to seal the pixel layer PXL, and a thin encapsulation layer including an organic layer and an inorganic layer may be disposed on the first substrate SUB1 to cover the pixel layer PXL.

The polarization layer POL may be disposed on the second substrate SUB2. The polarization layer POL may reduce reflectance of an external light that is incident from the display panel DP toward the display panel DP. As an example, the polarization layer POL may include a phase retarder and/or a polarizer.

The first pads PD1 may be disposed on a first side surface of the first substrate SUB1, a first side surface of the second substrate SUB2, and a first side surface of the encapsulation layer SAL, which is disposed between the first side surfaces of the first and second substrates SUB1 and SUB2. The first side surface D-OS of the display panel DP may be defined by the first side surface of the first substrate SUB1, the first side surface of the second substrate SUB2, and the first side surface of the encapsulation layer SAL.

Although not shown, an input-sensing portion, which senses an external input with an electrostatic capacitance method, may be disposed between the second substrate SUB2 and the polarization layer POL.

FIGS. 4 to 12 are diagrams schematically illustrating a method of fabricating a display device using the bonding apparatus shown in FIG. 1.

Figure 10:
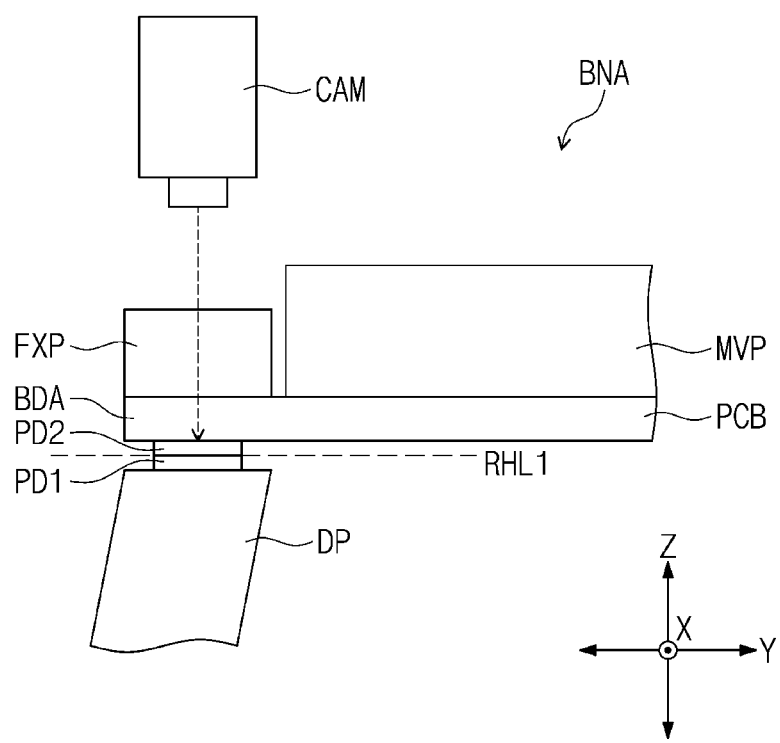
FIGS. 10 to 12 are diagrams schematically illustrating an operation of bonding a printed circuit board to a display panel.
Figure 11:
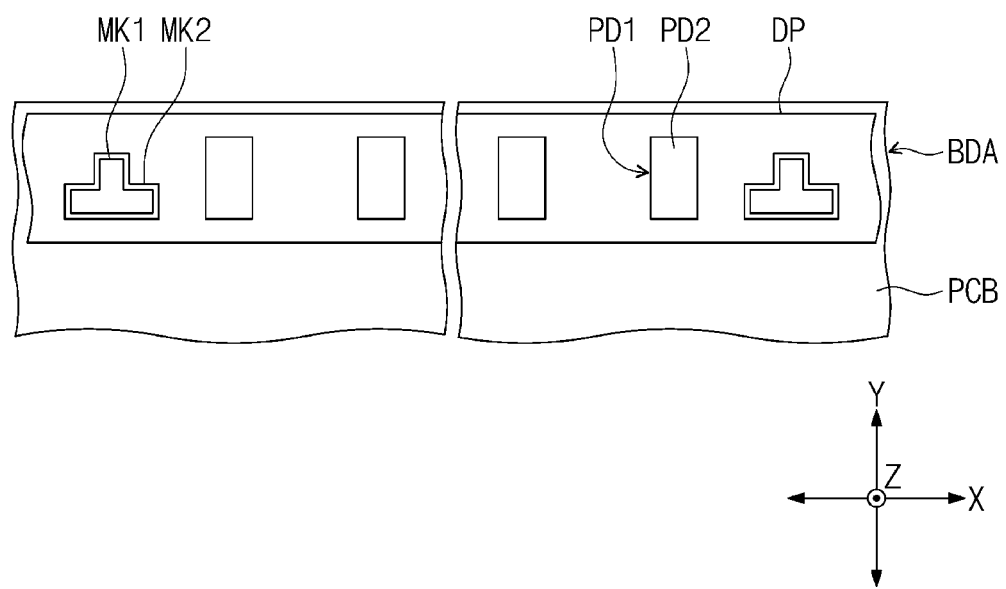
Figure 12:
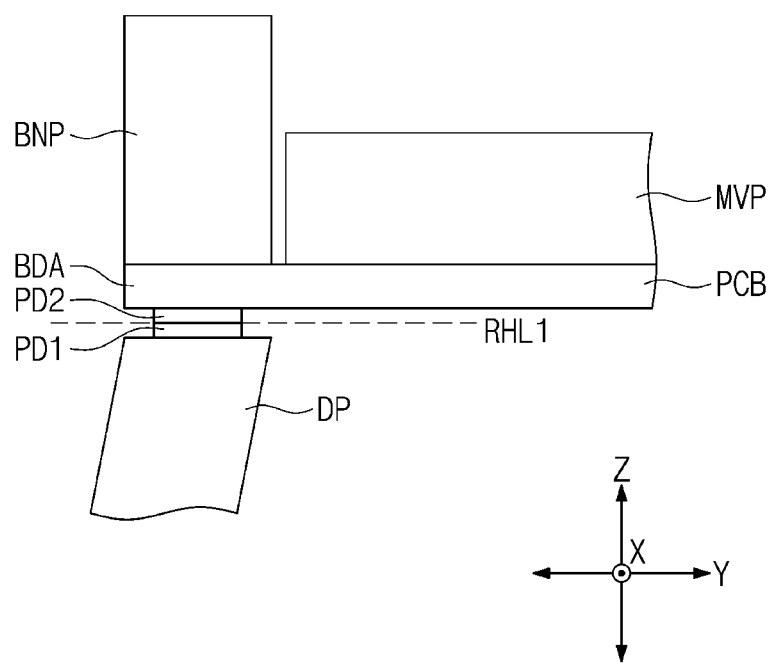

In detail, FIGS. 4 to 9 are diagrams schematically illustrating an alignment operation of the display panel DP. FIGS. 10 to 12 are diagrams schematically illustrating an operation of bonding the printed circuit board PCB with the display panel DP.

Figure 4:
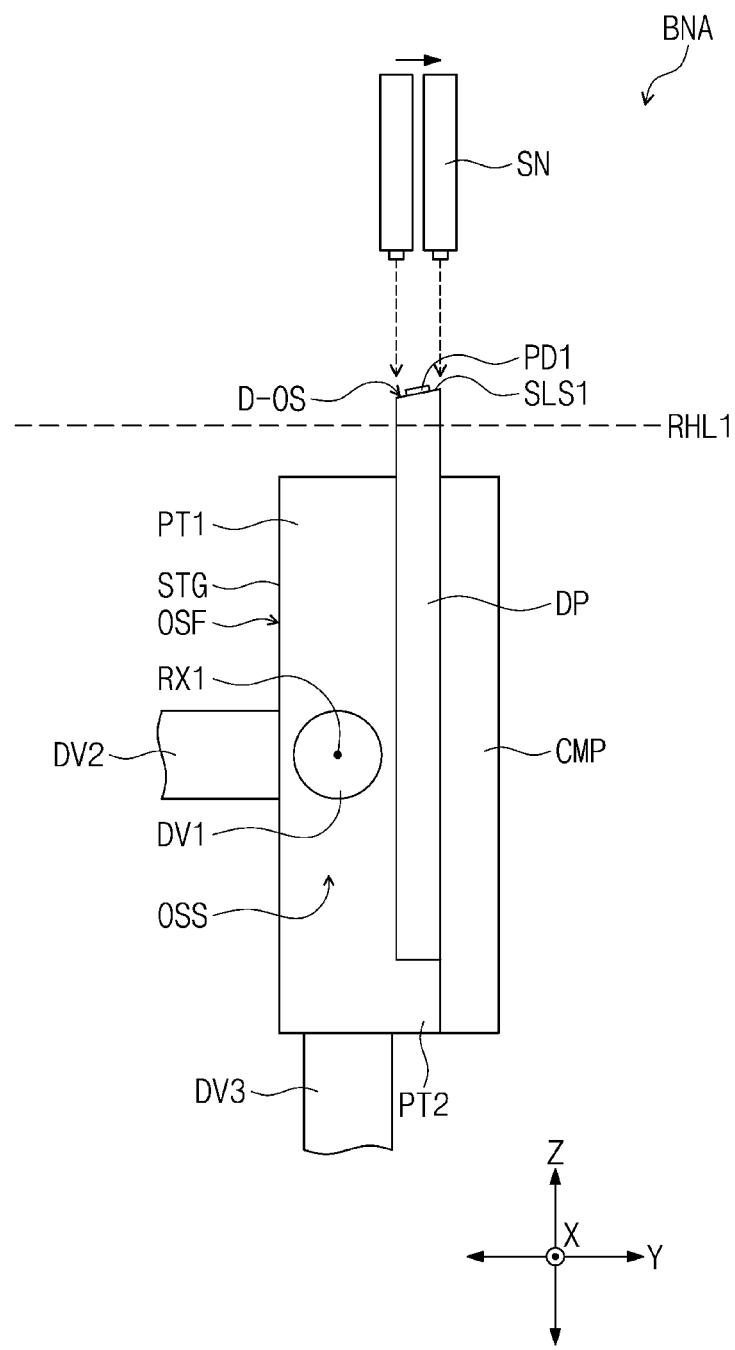
FIGS. 4 to 9 are diagrams schematically illustrating an alignment operation of a display panel.

Referring to FIG. 4, the display panel DP may be loaded on the stage STG. The clamp CMP may be moved toward the stage STG or in the direction parallel to the Y-axis Y to fasten the display panel DP. The first side surface D-OS of the display panel DP may be disposed above the stage STG and the clamp CMP and may be exposed to the outside.

The stage STG may include a first portion PT1, which is disposed parallel to an XZ-plane, and a second portion PT2, which extends from a bottom end of the first portion PT1 in the direction parallel to the Y-axis Y. The display panel DP may be formed on a first surface of the first portion PT1 and on the second portion PT2. The first surface of the first portion PT1 may be defined as a surface that is opposite to the first surface OSF of the stage STG.

The sensor portion SN may be disposed on the first side surface D-OS of the display panel DP. The sensor portion SN may be used to examine whether the first side surface D-OS is an inclined surface. For example, the sensor portion SN may measure a distance to the first side surface D-OS. The sensor portion SN may continuously measure a distance to the first side surface D-OS, while moving from a left side of the first side surface D-OS to a right side.

In the case where the first side surface D-OS is parallel to the Y-axis Y, the distance to the first side surface D-OS may be constant. However, in the case where the first side surface D-OS viewed in the direction of the X-axis X is an inclined surface that is inclined at an angle to the Y-axis Y, the distance to the first side surface D-OS may not be constant. The distance to the first side surface D-OS may be defined as height information of the first side surface D-OS. The measured height information of the first side surface D-OS may be provided to the controller CON.

In the case where the first side surface D-OS is an inclined surface, the inclined surface may include a first inclined surface SLS1, which is defined as an inclined surface when viewed in the direction of the X-axis X. A reference horizontal line may be defined in the bonding apparatus BNA. The reference horizontal line may include a first reference horizontal line RHL1 that is parallel to the Y-axis Y.

Figure 5:
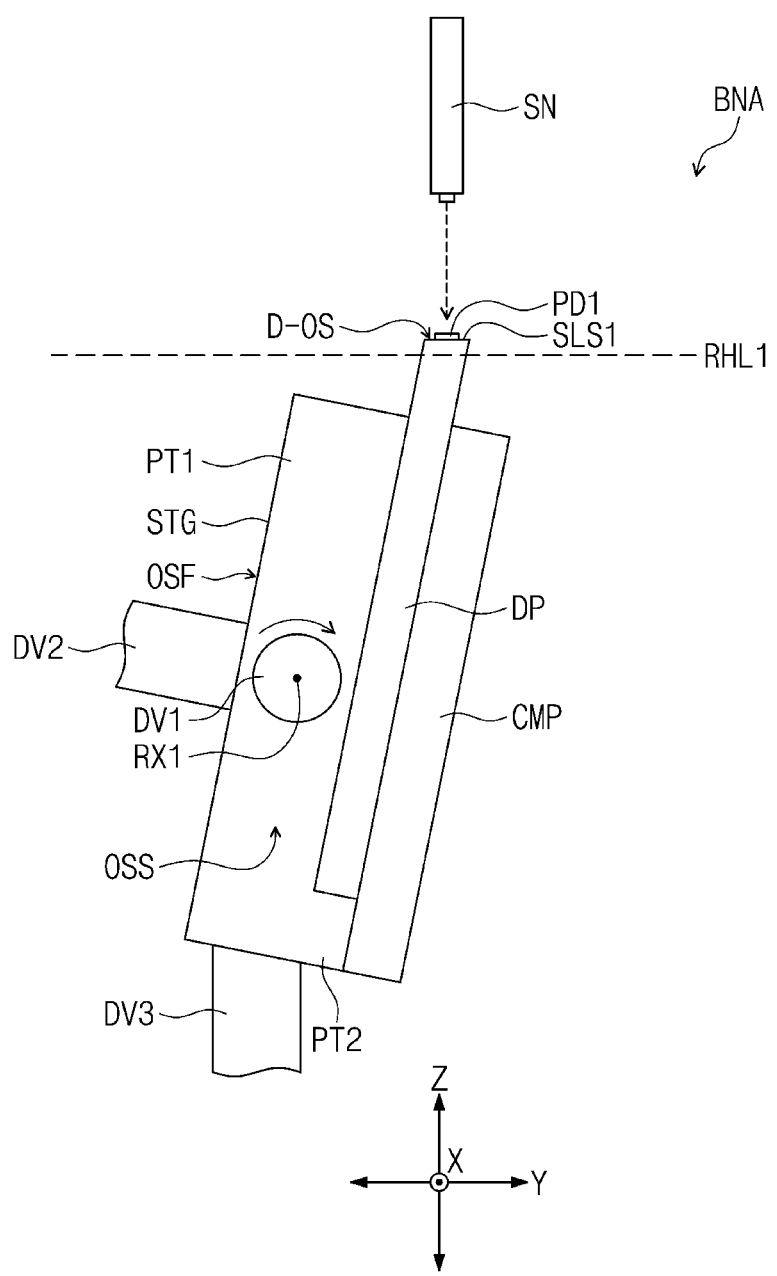

Referring to FIG. 5, the controller CON (shown in FIG. 1) may determine whether the first side surface D-OS is an inclined surface, based on the measured height information of the first side surface D-OS. In the case where the first side surface D-OS viewed in the direction of the X-axis X is determined to be an inclined surface, the first driver DV1 may be rotated under the control of the controller CON. The first driver DV1 may rotate the stage STG about the first rotation axis RX1 in a clockwise direction.

The stage STG may be rotated until the first side surface D-OS is parallel to the reference horizontal line. Accordingly, the first inclined surface SLS1 may be disposed parallel to the first reference horizontal line RHL1. Thereafter, a height of the first pad PD1, which is given as a distance to the top surface of the first pad PD1, may be measured by the sensor portion SN. Information on the height of the first pad PD1 may be provided to the controller CON.

Figure 6:
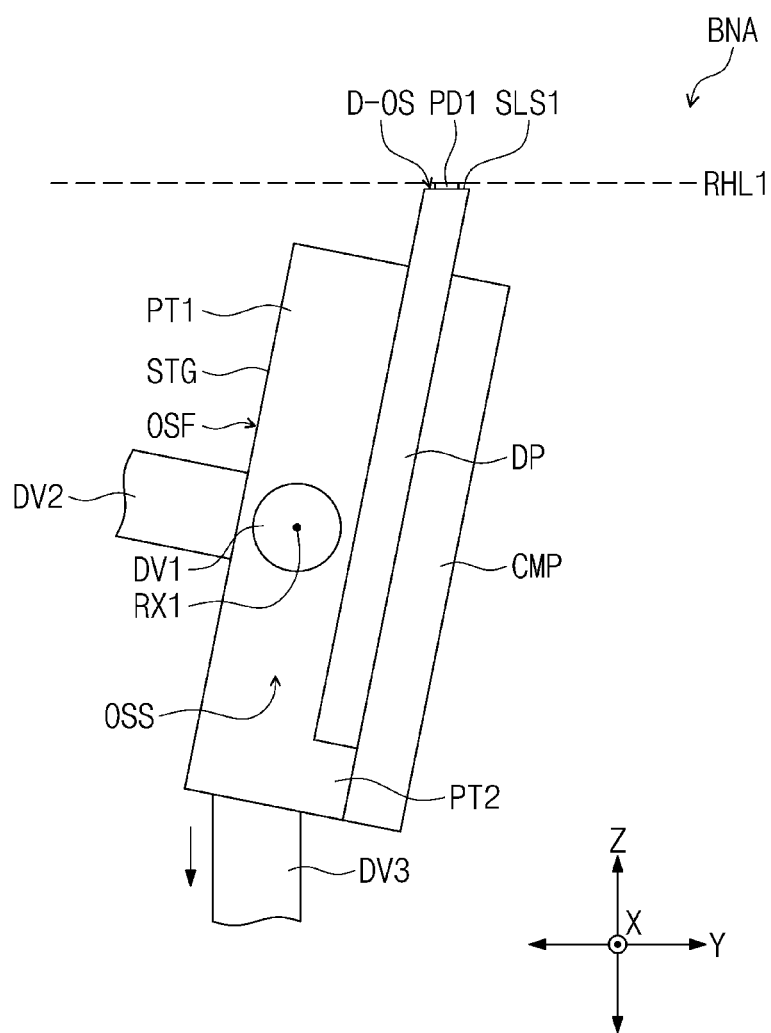

Referring to FIG. 6, the controller CON may drive the third driver DV3, based on the height information of the first pad PD1. The third driver DV3 may be moved in the direction parallel to the Z-axis Z to move the stage STG in the direction parallel to the Z-axis Z.

The stage STG may be moved until the first pad PD1 overlaps the reference horizontal line. In detail, the top surface of the first pad PD1 may overlap the first reference horizontal line RHL1. A bonding operation may be performed, after the disposing of the top surface of the first pad PD1 to overlap the first reference horizontal line RHL1.

Figure 7:
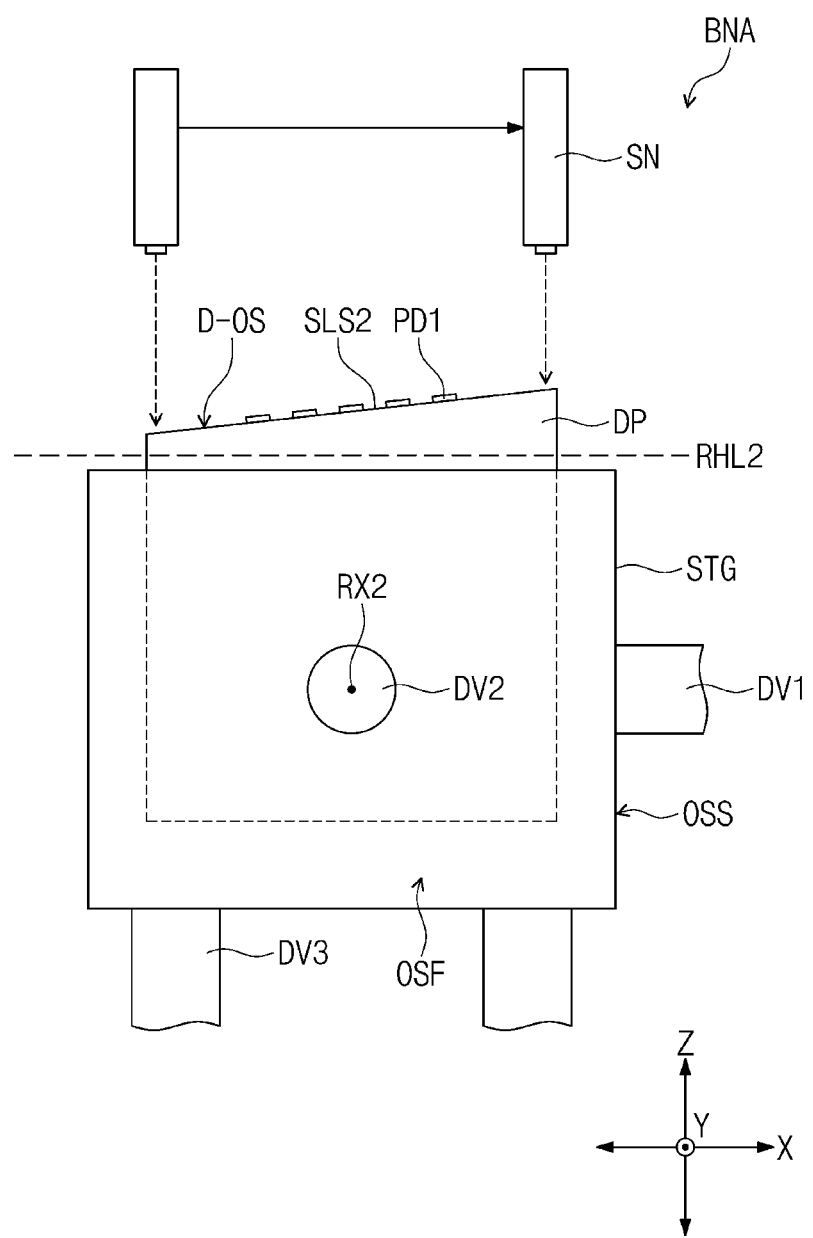

Referring to FIG. 7, the first side surface D-OS of the display panel DP may have an inclined surface when viewed in each of the directions parallel to the X- and Y-axes X and Y. For example, the first side surface D-OS of the display panel DP viewed in the direction of the Y-axis Y may be a surface that is inclined at an angle to the X-axis X. For example, the first side surface D-OS of the display panel DP may be inclined at an angle to a first side surface of the stage STG adjacent to the first side surface D-OS (i.e., the top portion of the stage STG).

The display panel DP may be disposed to be aligned with the stage STG. For example, opposite side surfaces of the display panel DP, which are parallel to the Z-axis Z and are opposite to each other in the X-axis X, may be parallel to opposite side surfaces of the stage STG, which are parallel to the Z-axis Z and are opposite to each other in the X-axis X. A second side surface of the display panel DP (i.e., the bottom end of the display panel DP), which is opposite to the first side surface D-OS and is parallel to the X-axis X, may be parallel to a second side surface of the stage STG (i.e., a bottom end of the stage STG), which is opposite to the first side surface of the stage STG and is parallel to the X-axis X.

The sensor portion SN may be used to examine whether the first side surface D-OS is an inclined surface when viewed in the direction of the Y-axis Y. The sensor portion SN may continuously measure a distance to the first side surface D-OS while moving from a left side of the first side surface D-OS to a right side when viewed in the direction of the Y-axis Y. The distance to the first side surface D-OS, which serves as information on the height of the first side surface D-OS, may be provided to the controller CON.

In the case where the first side surface D-OS is an inclined surface, the inclined surface may include a second inclined surface SLS2, which is defined as an inclined surface when viewed in the direction of the Y-axis Y. The reference horizontal line may include a second reference horizontal line RHL2 that is parallel to the X-axis X.

Figure 8:
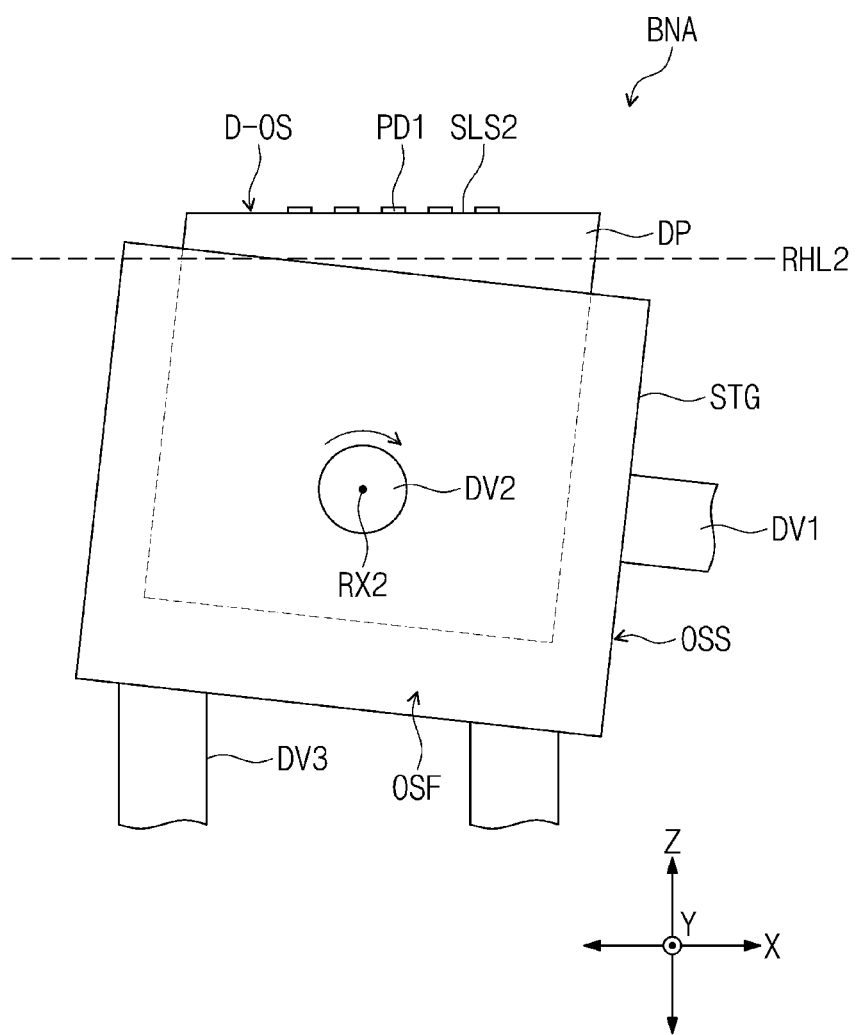

Referring to FIG. 8, the controller CON may determine whether the first side surface D-OS is the inclined surface, based on the measured height information of the first side surface D-OS. In the case where the first side surface D-OS is determined to be the inclined surface when viewed in the direction of the Y-axis Y, the controller CON may control a rotating motion of the second driver DV2. The second driver DV2 may rotate about the second rotation axis RX2 in a clockwise direction, and thus, the stage STG may rotate.

The stage STG may be rotated until the first side surface D-OS is parallel to the reference horizontal line. Thus, the second inclined surface SLS2 may be disposed parallel to the second reference horizontal line RHL2. Although not shown, heights of the first pads PD1, which are measured as distances to the top surfaces of the first pads PD1 by the sensor portion SN, may be provided to the controller CON, similar to that of FIG. 5. As an example, a height of a central one of the first pads PD1 may be measured by the sensor portion SN.

Figure 9:
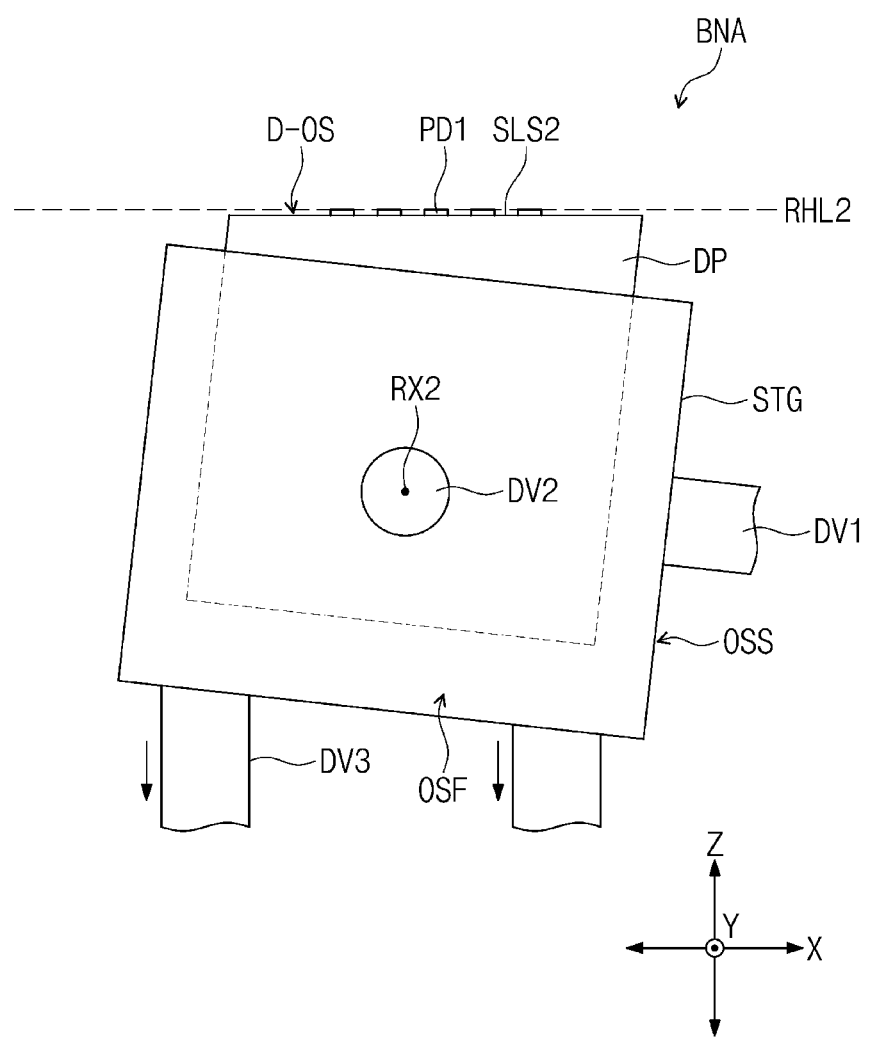

Referring to FIG. 9, the third driver DV3 may be moved in the direction parallel to the Z-axis Z by the controller CON, and as a result, the stage STG may be moved in the direction parallel to the Z-axis Z. The stage STG may be moved until the first pads PD1 overlaps the reference horizontal line. The top surfaces of the first pads PD1 may overlap the second reference horizontal line RHL2. A bonding operation may be performed when the overlapping of the top surfaces of the first pads PD1 with the second reference horizontal line RHL2 is completed.

In the case where the first side surface D-OS includes only the first inclined surface SLS1, the overlapping operation may be performed to allow only the first inclined surface SLS1 to overlap the first reference horizontal line RHL1. In the case where the first side surface D-OS includes only the second inclined surface SLS2, the overlapping operation may be performed to allow only the second inclined surface SLS2 to overlap the second reference horizontal line RHL2.

In the case where the first side surface D-OS includes both the first and second inclined surfaces SLS1 and SLS2, the overlapping operation may be performed to allow both the first and second inclined surfaces SLS1 and SLS2 to overlap the first and second reference horizontal lines RHL1 and RHL2, respectively.

In this case, the overlapping process may be performed in various orders. The operation of overlapping the first inclined surface SLS1 with the first reference horizontal line RHL1 may be performed first, but the disclosure is not limited to this example. For example, the operation of disposing the second inclined surface SLS2 to overlap the second reference horizontal line RHL2 may be performed first.

Referring to FIG. 10, the substrate moving portion MVP may move the printed circuit board PCB such that a bonding region BDA of the printed circuit board PCB is placed on the display panel DP. The bonding region BDA may be defined as a region of the printed circuit board PCB, on which a second pad PD2 is disposed. The second pad PD2 may be disposed under the bonding region BDA. The bonding region BDA may be disposed on the first pad PD1 such that the second pad PD2 faces the first pad PD1.

The fixing portion FXP may be disposed on the bonding region BDA. The fixing portion FXP may be used to fasten the bonding region BDA. The camera portion CAM may be disposed on the fixing portion FXP. Since the fixing portion FXP includes an optically transparent material, the fixing portion FXP may not affect the operation of the camera portion CAM even in case that the fixing portion FXP is disposed on the bonding region BDA.

Referring to FIG. 11, first marks MK1 may be disposed on the first side surface D-OS of the display panel DP. The first marks MK1 may be formed to have an embossed shape. The first pads PD1 may be arranged in the direction parallel to the X-axis X. The first pads PD1 may be disposed between the first marks MK1.

Second marks MK2 may be disposed on the bonding region BDA. In an embodiment, the second marks MK2 may be disposed on a bottom surface of the bonding region BDA of FIG. 10. The second marks MK2 may be formed to have an embossed shape. The second pads PD2 may be arranged in the direction parallel to the X-axis X. The second pads PD2 may be disposed between the second marks MK2.

The camera portion CAM may be used to obtain images of the first marks MK1 and the second marks MK2. The obtained position information of the first and second marks MK1 and MK2 may be provided to the controller CON. The controller CON may dispose the second marks MK2 to overlap the first marks MK1, based on the obtained position information of the first and second marks MK1 and MK2.

Positions of the substrate moving portion MVP and the printed circuit board PCB may be controlled by the controller CON, such that the second marks MK2 overlaps the first marks MK1. However, the disclosure is not limited to this example. In an embodiment, positions of the stage STG and the display panel DP may be controlled by the controller CON, such that the first marks MK1 overlaps the second marks MK2. Since the second marks MK2 are disposed to overlap the first marks MK1, the first pads PD1 and the second pads PD2 may be aligned with each other.

Referring to FIG. 12, the bonding portion BNP may be disposed on the bonding region BDA. The second pad PD2 may be bonded with the first pad PD1 by the bonding portion BNP. The bonding process may be performed in various manners. For example, an ultrasonic bonding method or an anisotropic conductive film (ACF) bonding method may be used to bond the second pad PD2 with the first pad PD1.

In the case where an ultrasonic bonding method is used to bond the first and second pads PD1 and PD2, an ultrasonic vibration of the bonding portion BNP may be applied to the first and second pads PD1 and PD2 disposed in contact with each other. The ultrasonic vibration may be transmitted to the second pad PD2 through the bonding region BDA. In this case, the second pad PD2 may be bonded with the first pad PD1 by the ultrasonic vibration.

In the case where an ACF bonding method is used, an anisotropic conductive film may be disposed between the first pad PD1 and the second pad PD2. The bonding portion BNP may press the bonding region BDA toward the first pad PD1. In an embodiment, the bonding portion BNP may produce a specific amount of heat, which is used for the thermocompression of the anisotropic conductive film. As a result, the second pad PD2 may be bonded with the first pad PD1 by the anisotropic conductive film.

The operation of bonding the first and second pads PD1 and PD2 with each other has been described with reference to the sectional view perpendicular to the X-axis X. However, when viewed in the direction of the Y-axis Y, the operation of bonding the first and second pads PD1 and PD2 with each other may also be performed in the same manner.

In an embodiment, if the first side surface D-OS of the display panel DP includes an inclined surface, after the inclined surface is aligned with the reference horizontal line, the bonding process may be performed. The bonding process may be performed at the reference horizontal line. Accordingly, the printed circuit board PCB may be easily bonded with the display panel DP.

FIGS. 13 to 16 are diagrams schematically illustrating an alignment operation of a display panel, according to an embodiment of the disclosure.

Hereinafter, the alignment operation of the display panel DP shown in FIGS. 13 to 16 will be described in more detail with focus on features that are different from those of FIGS. 4 to 9.

Although not shown in FIGS. 13 to 16, a height of the first side surface D-OS may be measured by the sensor portion SN and then may be provided to the controller CON, as described above. A height of the first pad PD1 may be measured by the sensor portion SN and then may be provided to the controller CON.

Figure 13:
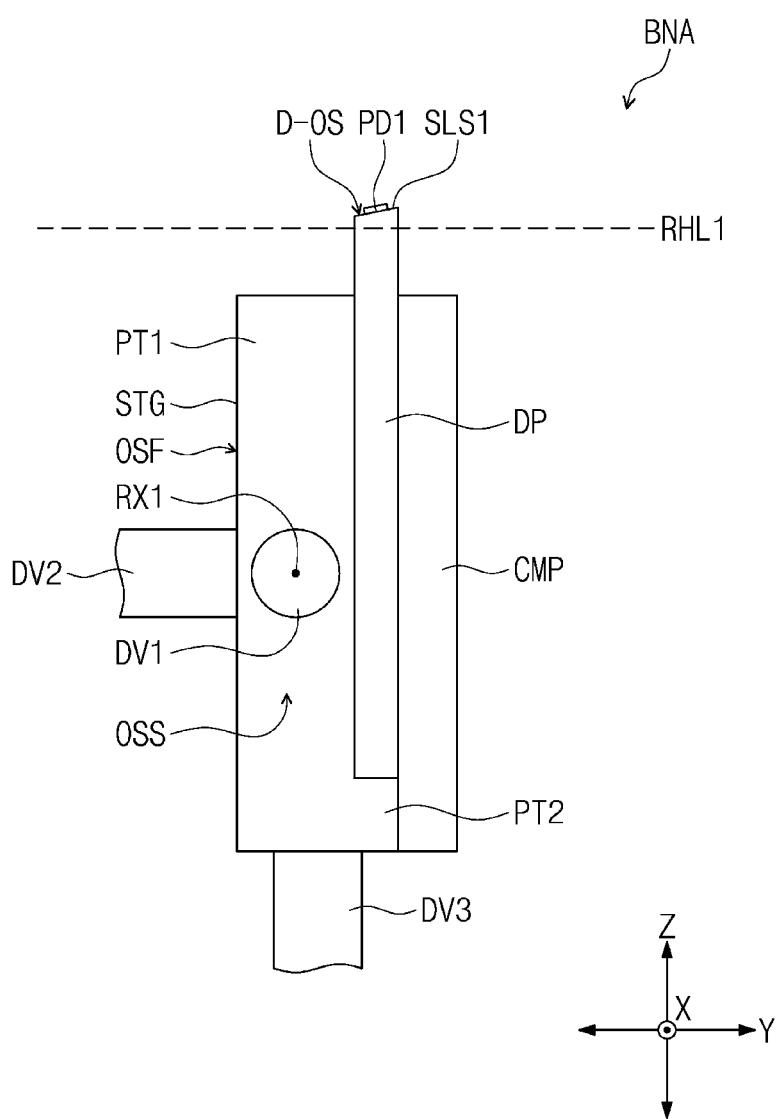
FIGS. 13 to 16 are diagrams schematically illustrating an alignment operation of a display panel, according to an embodiment.
Figure 14:
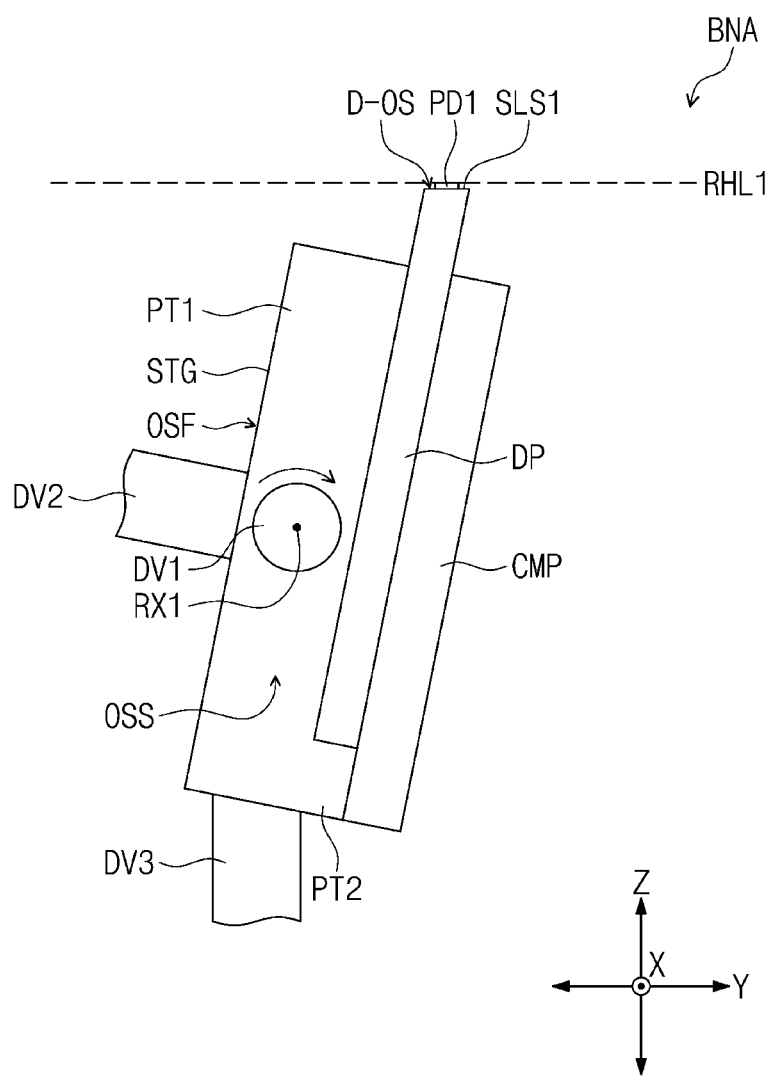

Referring to FIGS. 13 and 14, the first side surface D-OS may have the first inclined surface SLS1 when viewed in the direction of the X-axis X. A height of the first inclined surface SLS1 may be different from the height of the first inclined surface SLS1 shown in FIG. 4. In an embodiment, the third driver DV3 may not be driven, depending on the height of the first inclined surface SLS1.

For example, the controller CON may cause the first driver DV1 to rotate about the first rotation axis RX1 to rotate the stage STG. If, as a result of the rotation of the stage STG, the first inclined surface SLS1 becomes parallel to the first reference horizontal line RHL1, the top surface of the first pad PD1 may overlap the first reference horizontal line RHL1.

Since the top surface of the first pad PD1 overlaps the first reference horizontal line RHL1, it may be unnecessary to move the display panel DP in the direction parallel to the Z-axis Z. In this case, the third driver DV3 may not be driven.

Figure 15:
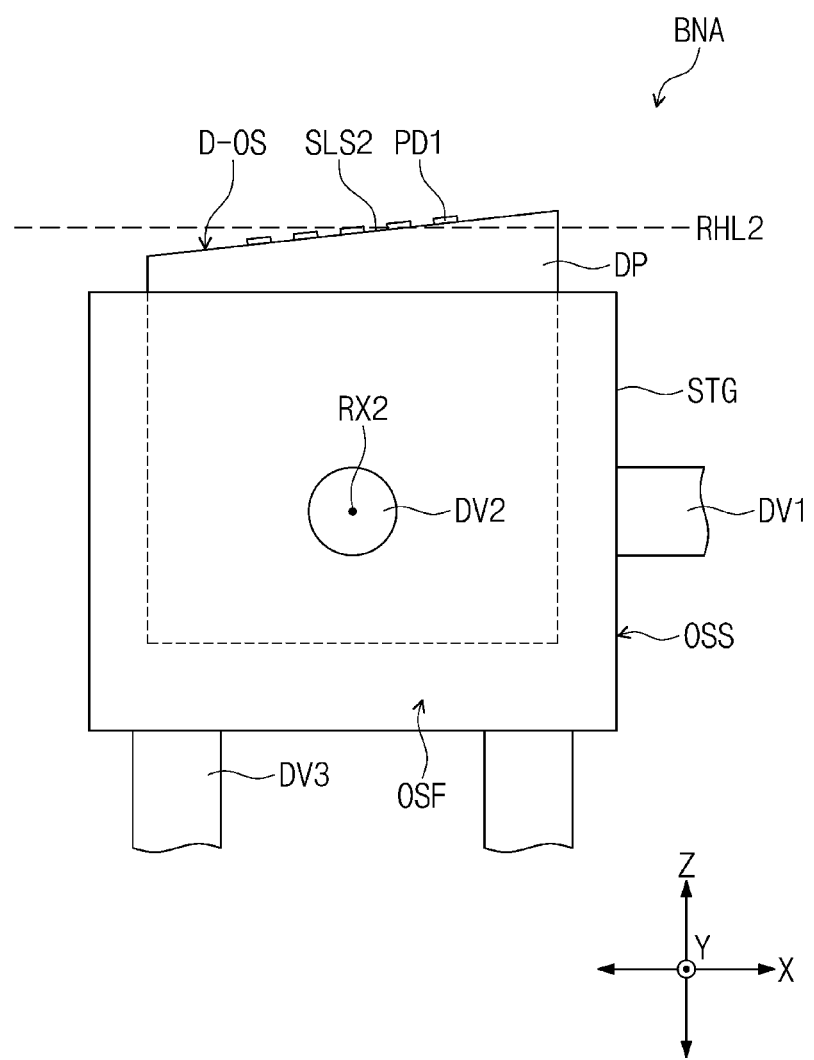
Figure 16:
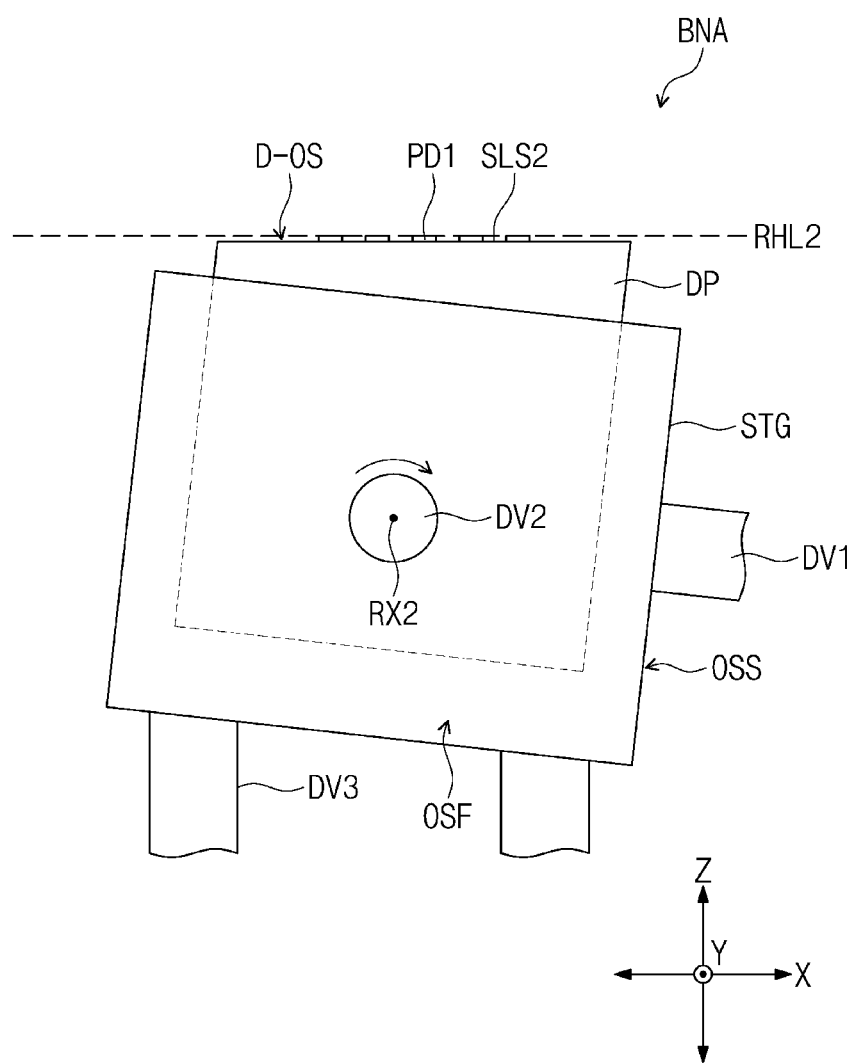

Referring to FIGS. 15 and 16, the first side surface D-OS may have the second inclined surface SLS2 when viewed in the direction of the Y-axis Y. A height of the second inclined surface SLS2 may be different from the height of the second inclined surface SLS2 shown in FIG. 7. The third driver DV3 may not be driven, depending on the height of the second inclined surface SLS2.

For example, the controller CON may cause the second driver DV2 to rotate about the second rotation axis RX2, to rotate the stage STG. If, as a result of the rotation of the stage STG, the second inclined surface SLS2 becomes parallel to the second reference horizontal line RHL2, the top surfaces of the first pads PD1 may overlap the second reference horizontal line RHL2.

Since the top surfaces of the first pads PD1 overlaps the second reference horizontal line RHL2, it may be unnecessary to move the display panel DP in the direction parallel to the Z-axis. In this case, the third driver DV3 may not be driven.

A subsequent bonding operation may be performed in substantially the same manner as the bonding operation described with reference to FIGS. 10 to 12.

Figure 17:
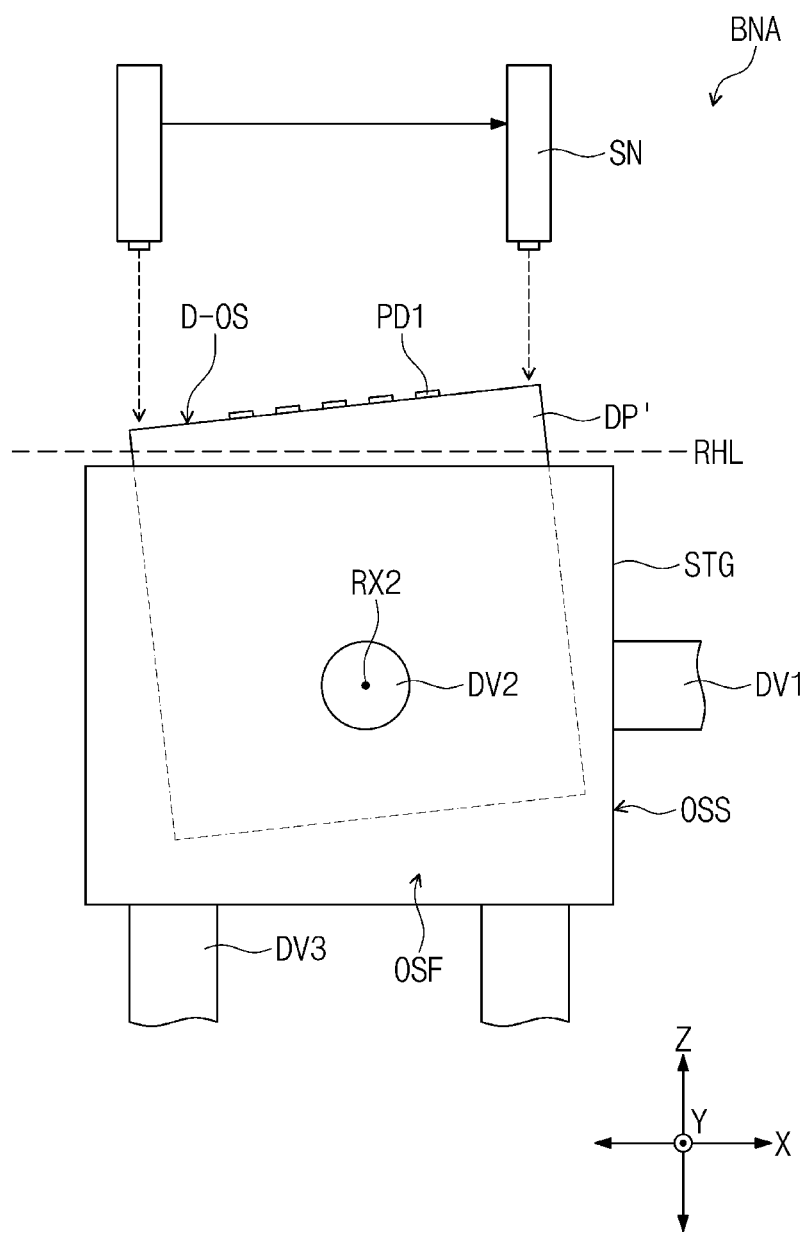
FIGS. 17 to 19 are diagrams schematically illustrating an alignment operation of a display panel according to an embodiment.
Figure 18:
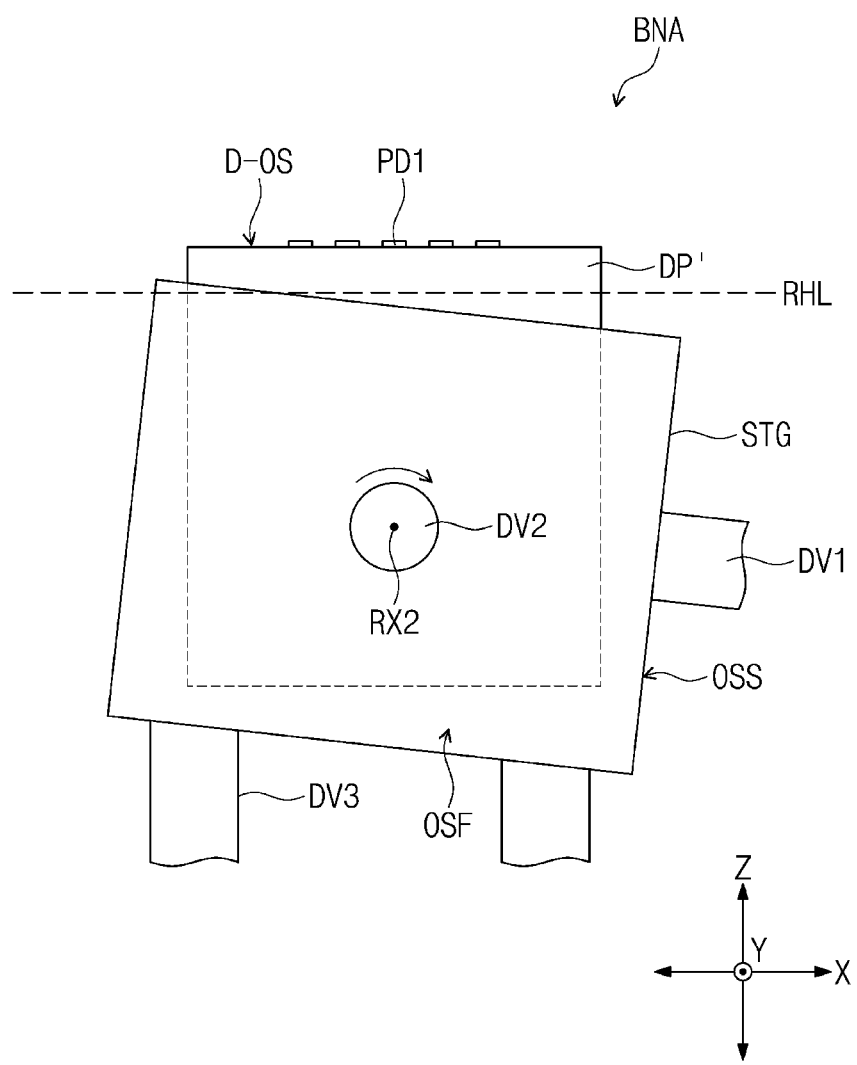
Figure 19:
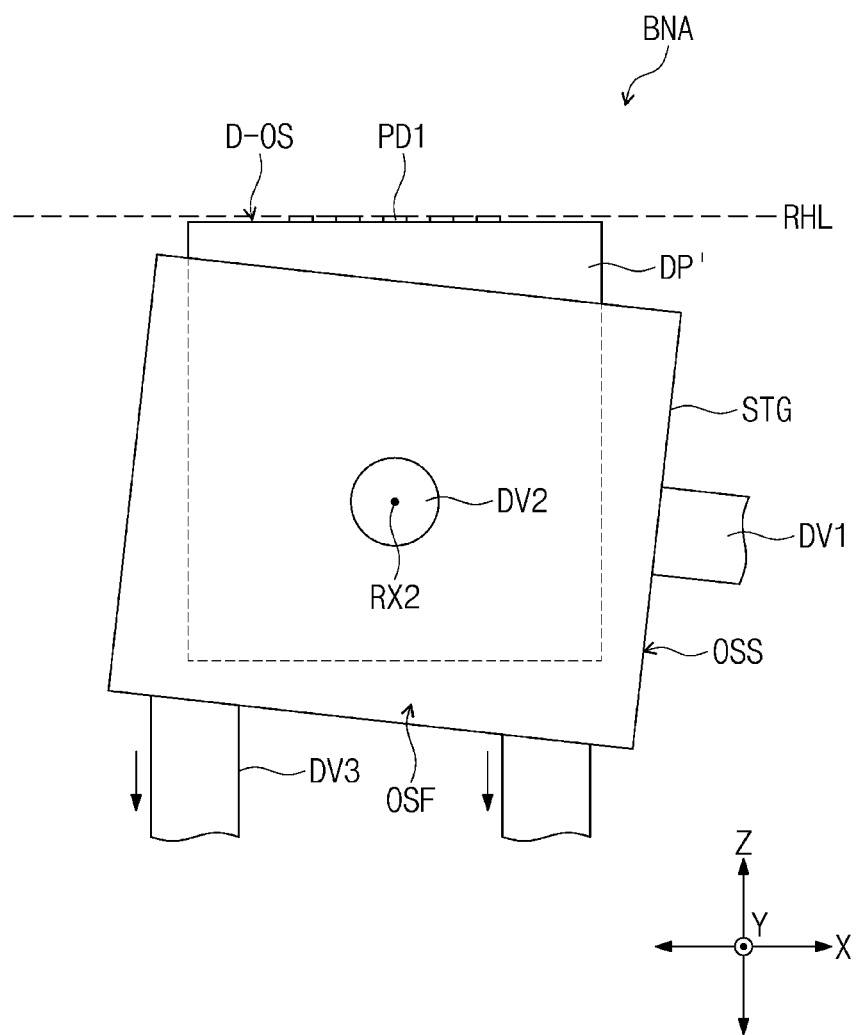

FIGS. 17 to 19 are diagrams schematically illustrating an alignment operation of a display panel according to an embodiment of the inventive concept.

The alignment operation of the display panel DP shown in FIGS. 17 to 19 may be substantially the same as the alignment operation of the display panel DP shown in FIGS. 7 to 9, except for differences in the shape of the display panel DP.

Referring to FIG. 17, a display panel DP' may be disposed to be not aligned with the stage STG. For example, when viewed in the direction of the Y-axis Y, the display panel DP' may be disposed to be tilted with respect to the stage STG. In this case, opposite side surfaces of the display panel DP', which extend from both ends of the first side surface D-OS in a direction perpendicular to the first side surface D-OS, may not be parallel to opposite side surfaces of the stage STG.

A second side surface of the display panel DP', which is opposite to the first side surface D-OS, may extend parallel to the first side surface D-OS. The first and second side surfaces of the display panel DP' may not be parallel to the first and second side surfaces of the stage STG. Since the display panel DP' is not aligned with the stage STG, the first side surface D-OS of the display panel DP' may be defined as an inclined surface with respect to the stage STG.

The sensor portion SN may measure a distance to the first side surface D-OS while moving from a left side of the first side surface D-OS to a right side and may provide the measured height information of the first side surface D-OS to the controller CON.

Referring to FIG. 18, if the first side surface D-OS, when viewed in the direction of the Y-axis Y, is determined to be inclined, the controller CON may rotate the second driver DV2 and the stage STG or may cause them to rotate. For example, the stage STG may be rotated in such a way that the first side surface D-OS is disposed parallel to a reference horizontal line RHL. The reference horizontal line RHL may be the second reference horizontal line RHL2 described above.

Referring to FIG. 19, the stage STG may be moved in the direction parallel to the Z-axis Z by the third driver DV3 such that the top surfaces of the first pads PD1 overlaps the reference horizontal line RHL. A bonding operation may be performed, after the disposing of the top surfaces of the first pads PD1 to overlap the reference horizontal line RHL.

According to an embodiment of the disclosure, in the case where a first side surface of a display panel includes an inclined surface, after the inclined surface is aligned with a reference horizontal line, the bonding process may be performed. The bonding process may be performed at the reference horizontal line. Accordingly, a printed circuit board may be easily bonded with the display panel.

In an embodiment, the controller CON may include a processor; each of the first, second, and third driver DV1, DV2, DV3 may include a motor; the sensor portion SN may include a sensor; and the bonding portion BNP may include a (ultrasonic) bonding machine.

While example embodiments of the disclosure have been particularly shown and described, it will be understood by one of ordinary skill in the art that variations in form and detail may be made therein without departing from the spirit and scope of the disclosure.

What is claimed is:

1. A method of fabricating a display device, comprising:
   disposing a display panel on a stage to be parallel to an XZ-plane defined by a horizontal X-axis and a vertical Z-axis;
   measuring a height of a first side surface of the display panel in a direction of the Z-axis;
   rotating the stage such that the first side surface is parallel to a reference horizontal line in case that measured heights indicate that the first side surface includes an inclined surface;
   moving the display panel in a direction of the Z-axis such that a first pad disposed on the first side surface overlaps the reference horizontal line; and
   bonding a second pad of a printed circuit board with the first pad.

2. The method of claim 1, comprising:
   determining that the inclined surface includes a first inclined surface, which is inclined when viewed in a direction of the X-axis; and
   determining that the inclined surface includes a second inclined surface, which is inclined when viewed in a direction of a Y-axis perpendicular to the XZ-plane,
   wherein the reference horizontal line comprises:
      a first reference horizontal line parallel to the Y-axis; and
      a second reference horizontal line parallel to the X-axis.

3. The method of claim 2, wherein the rotating of the stage comprises rotating the stage about a first rotation axis parallel to the X-axis such that the first inclined surface is parallel to the first reference horizontal line.

4. The method of claim 3, wherein the moving of the display panel in the direction of the Z-axis comprises:
   measuring a height of the first pad; and
   moving the stage in the direction of the Z-axis such that the first pad overlaps the first reference horizontal line.

5. The method of claim 2, wherein the rotating of the stage comprises rotating the stage about a second rotation axis parallel to the Y-axis such that the second inclined surface is parallel to the second reference horizontal line.

6. The method of claim 5, wherein the moving of the display panel in the direction of the Z-axis comprises:
   measuring a height of the first pad; and
   moving the stage in the direction of the Z-axis such that the first pad overlaps the second reference horizontal line.

7. The method of claim 1, wherein the moving of the display panel in the direction of the Z-axis comprises disposing a top surface of the first pad to overlap the reference horizontal line.

8. The method of claim 1, wherein the bonding of the second pad with the first pad comprises:
   placing a bonding region of the printed circuit board, on which the second pad is disposed, on the first pad with the second pad facing the first pad;
   aligning the first pad and the second pad with each other; and
   bonding the second pad with the first pad.

9. The method of claim 8, wherein the aligning of the first pad and the second pad comprises:
   placing a fixing portion on the bonding region;
   obtaining an image of a first mark disposed on the first side surface and an image of a second mark disposed on a bottom surface of the bonding region; and
   disposing the second mark to overlap the first mark, based on a result of the obtained images.

10. The method of claim 1, wherein the bonding of the second pad with the first pad comprises applying an ultrasonic wave to the second pad to bond the second pad with the first pad.

11. The method of claim 1, wherein the bonding of the second pad with the first pad comprises:
   disposing an anisotropic conductive film between the first pad and the second pad; and
   bonding the second pad with the first pad using the anisotropic conductive film.

12. The method of claim 1, wherein the display panel comprises:
   opposite side surfaces that are parallel to the Z-axis and are opposite to each other in a direction of the X-axis; and
   a second side surface that is opposite to the first side surface and is parallel to the direction of the X-axis.

13. The method of claim 1, wherein the display panel comprises:
   opposite side surfaces that extend from both ends of the first side surface in a direction perpendicular to the first side surface; and
   a second side surface that is opposite to the first side surface and extends parallel to the first side surface.

14. A method of fabricating a display device, comprising:
   disposing a display panel on a stage to be parallel to an XZ-plane defined by a horizontal X-axis and a vertical Z-axis;
   measuring a height of a first side surface of the display panel in a direction of the Z-axis;
   rotating the stage such that a top surface of a first pad disposed on the first side surface overlaps a reference horizontal line in case that measured heights indicate that the first side surface includes an inclined surface; and
   bonding a second pad of a printed circuit board with the first pad.

15. The method of claim 14, comprising:
   determining that the inclined surface includes a first inclined surface, which is inclined when viewed in a direction of the X-axis; and
   determining that the inclined surface includes a second inclined surface, which is inclined when viewed in a direction of a Y-axis perpendicular to the XZ-plane,
   wherein the reference horizontal line comprises:
      a first reference horizontal line parallel to the Y-axis; and
      a second reference horizontal line parallel to the X-axis.

16. The method of claim 15, wherein the rotating of the stage comprises rotating the stage about a first rotation axis parallel to the X-axis such that the top surface of the first pad overlaps the first reference horizontal line.

17. The method of claim 15, wherein the rotating of the stage comprises rotating the stage about a second rotation axis parallel to the Y-axis such that the top surface of the first pad overlaps the second reference horizontal line.

* * * * *